United States Patent
Hwang et al.

(10) Patent No.: US 6,569,295 B2
(45) Date of Patent: May 27, 2003

(54) METHOD FOR GRADING SURFACE TOPOGRAPHY FOR IMPROVED STEP COVERAGE AND PLANARIZATION

(75) Inventors: Cherngye Hwang, San Jose, CA (US); Eun Kyoung Row, San Jose, CA (US); Ning Shi, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/812,608

(22) Filed: Mar. 20, 2001

(65) Prior Publication Data

US 2002/0134672 A1 Sep. 26, 2002

(51) Int. Cl.[7] .............................. C23F 1/00; B44C 1/22
(52) U.S. Cl. ...................... 204/192.3; 204/192.34; 204/192.35; 216/66; 216/67; 216/22
(58) Field of Search ........................ 204/192.32, 192.34, 204/192.35, 192.37, 192.3; 216/22, 63, 66, 67

(56) References Cited

U.S. PATENT DOCUMENTS

| | | | |
|---|---|---|---|
| 4,460,434 A | * | 7/1984 | Johnson et al. ........ 204/192.34 |
| 4,670,091 A | * | 6/1987 | Thomas et al. ........ 204/192.35 |
| 4,874,493 A | * | 10/1989 | Pan ........................ 204/192.11 |
| 5,091,048 A | * | 2/1992 | Thomas ........................ 156/345 |
| 5,114,556 A | | 5/1992 | Lamont, Jr. |
| 5,416,048 A | | 5/1995 | Blalock et al. |
| 5,544,775 A | | 8/1996 | Kerth et al. |
| 5,943,187 A | | 8/1999 | Chen et al. |

FOREIGN PATENT DOCUMENTS

JP          61188936 A   *   8/1986   ........... H01L/21/30

* cited by examiner

*Primary Examiner*—Patrick Ryan
*Assistant Examiner*—Gregg Cantelmo
(74) *Attorney, Agent, or Firm*—Liu & Liu (57) ABSTRACT

A method is provided for grading the surface topography of a surface to improve step coverage for an overcoat. In accordance with one aspect of the present invention, an ABS of a slider and sensitive element of a magnetic head is graded to provide better step coverage of an overcoat of ultra-thin DLC film. After lapping the ABS, a thin film is deposited on the lapped surface to cover any scratches, irregularities, and steps. The thin film is sputter etched at a glancing angle to grade the topography of the slider ABS. Sputtering at a glancing angle removes the thin film in planar regions faster than the thin film under the shadow of the glancing angle, which is near surface irregularities. The graded surface is then covered by a DLC deposition.

15 Claims, 6 Drawing Sheets

METHOD FOR GRADING SURFACE TOPOGRAPHY FOR IMPROVED STEP COVERAGE AND PLANARIZATION

BACKGROUND OF THE INVENTION

1. Field of the Invention

This invention relates in general to grading surface topography to improve step coverage and planarization, and particularly to a method of preparing the air bearing surface of a magnetic head, and more particularly to a method of grading the surface topography of a slider used in a magnetic head to improve step coverage of a protective carbon layer on the air bearing surface of the slider.

2. Description of Related Art

In the preparation of surfaces involving deposition and etching, it is sometimes desirable to maintain adequate step coverage to obtain a smooth surface for the final work piece. U.S. Pat. No. 5,114,556 describes a method for enhancing step coverage and planarization on semiconductor wafers for the manufacturing of microelectronic devices. According to this patent, the method improves step coverage and planarization by sputter depositing metal at an oblique angle of incidence to the wafer.

For example, a smooth final working surface is desirable in the forming of a slider for supporting the magnetic heads in a magnetic disk drive. By way of background, a write head is typically combined with a magnetoresistive (MR) read head to form a merged MR head, certain elements of which are exposed at an air-bearing surface (ABS). In a magnetic disk drive a magnetic disk is rotated adjacent to and a short distance (fly height) from the ABS so that the write fields magnetize the disk along circular tracks. The written circular tracks then contain magnetized segments with fields detectable by a read head. An MR read head includes an MR sensor sandwiched between first and second non-magnetic gap layers and located at the ABS. Hereinafter, for reasons apparent to one skilled in the art, the MR sensors of the merged MR head and the read head are referred to as "sensitive elements."

One or more merged MR heads may be employed in a magnetic disk drive for reading and writing information on circular tracks of a rotating disk. A merged MR head is mounted on a slider carried on a suspension. The suspension is mounted to an actuator which rotates the magnetic head to locations corresponding to desired tracks. As the disk rotates, an air cushion is generated between the rotating disk and the ABS of the slider. A force of the air cushion against the air bearing surface is opposed by an opposite loading force of the suspension, thus maintaining the fly height from the surface of the disk. The slider and the sensitive elements of a magnetic head are subjected to wear during take off and landing of the slider with respect to the magnetic disk. When the sensitive elements are worn, their dimensions change and reduce the quality of head performance. For this reason, an overcoat is usually applied to protect the slider and the sensitive elements. Also, perhaps more importantly, the overcoat protects the sensitive elements from environmental attacks during use by shielding them from ambient.

Bit density is the number of bits written by a head over a square inch of a magnetic disk. The bit density increases when the sensitive elements of the magnetic head are positioned closer to the disk. A magnetic head has a magnetic height corresponding to the distance between the center of the magnetizable layer on a magnetic disk and surfaces of the aforementioned sensitive elements facing the magnetic disk. The fly height, the thickness of any overcoat on the sensitive elements and the slider, as well as the disc and the thickness of the magnetizable layer all contribute to the spacing loss of the magnetic head. Since the thickness of the slider overcoat contributes to spacing loss of the bit density, it is desirable to keep the overcoat as thin as possible.

Diamond-Like-Carbon (DLC) have been used to provide an overcoat on magnetic recording head sliders in disk drives for protection against corrosion and contact wear. One of the factors which limits the reduction of the DLC film thickness is the often unavoidable abrupt changes in the slider topography during the fabrication of the sliders. After the fabrication, the slider topography surface is often uneven (1) in the area at and around the sensitive elements, where dissimilar materials laminate, and (2) in the areas where there are scratches and defects caused by mechanical operations such as lapping or polishing. These areas are the weakest location for pinhole-free DLC film coverage when the film is near its lowest thickness threshold, and thus degrading the intended corrosion protection. Therefore, to achieve a DLC film that is as thin as possible, it is desirable to have a slider surface that is as smooth as possible, with minimum degree of scratches and other irregularities.

Assignee's U.S. Pat. No. 5,943,187 describes a method of applying an overcoat to the air bearing surface (ABS) of a slider to improve step coverage and to reduce spacing loss by reducing the overcoat thickness. The slider ABS is initially lapped. Then an overcoat is applied to the ABS to fill in the scratches and irregularities. This overcoat is sputter etched or ion milled, which thins the overcoat and redistributes some of the overcoating materials from the peaks to the valleys of the overcoat, taking advantage of the physics of resputtering of a vertical ion beam (90°).

U.S. Pat. No. 5,416,048 describes a phenomenon that the sputter yield at the corners of a substrate is higher than that at the horizontal surface of the substrate as well as that at vertical surfaces parallel to the ion beam. This phenomenon is said to contribute to the wearing of the corners of the substrate, when the substrate is subjected to sputter etching at a 90 degree angle. Redeposition of resputtered material on the vertical sidewalls and preferential removal of corners due to crystallographical etching anisothropy enhances planarization of treated substrates. Again, there is no indication or teaching from this patent that etching is to be performed at a glancing angle relative to the horizontal surface of the substrate.

None of these prior art patents teach etching at a glancing angle, which as explained below, produces an ABS with improved smoothness.

SUMMARY OF THE INVENTION

The present invention relates to an improved method of grading surface topography to improve step coverage for an overcoat. Specifically, this invention employs a method that selectively grades an uneven surface by applying a filler coating and etching at an oblique or glancing angle, which is controlled to yield a smooth undersurface for the application of a final overcoat.

By way of example and not limitation of the present invention, the ABS of a slider is prepared in accordance with the present invention so that the surface has improved smoothness. In a preferred embodiment, after lapping and/or polishing of the ABS, an initial filler film such as Si, is deposited on the lapped and/or polished surface covering any scratches, irregularities, and steps caused during the fabrication of the slider. Next, the thin film on the ABS is sputter-etched at a glancing angle to grade the topography of the ABS. In a controlled manner, glancing angle sputtering removes the thin film in the planar regions faster than material under the shadow of the glancing angle, which is near surface irregularities. The result is the reduction of surface irregularities and a more even surface topography across the slider ABS. A DLC film is then deposited on the graded ABS. The improved smoothness of the undersurface, which has been subjected to a glancing angle etch, enables an improved coverage of the final DLC film.

DETAILED DESCRIPTION OF THE PREFERRED EMBODIMENT

This invention is described in a preferred embodiment in the following description with references to the following figures. While this invention is described in terms of the best mode of achieving this invention's objectives, it will be appreciated by those skilled in the art that variation may be accomplished in view of these teachings without deviating from the spirit or scope of the invention.

The present invention is described in reference to grading an ABS surface of a slider for use in a magnetic disk drive. It is understood that the present invention is applicable to grading of other types of surfaces to improve step coverage of overcoat layers for use in other devices without departing from the scope and spirit of the present invention.

Figure 1:
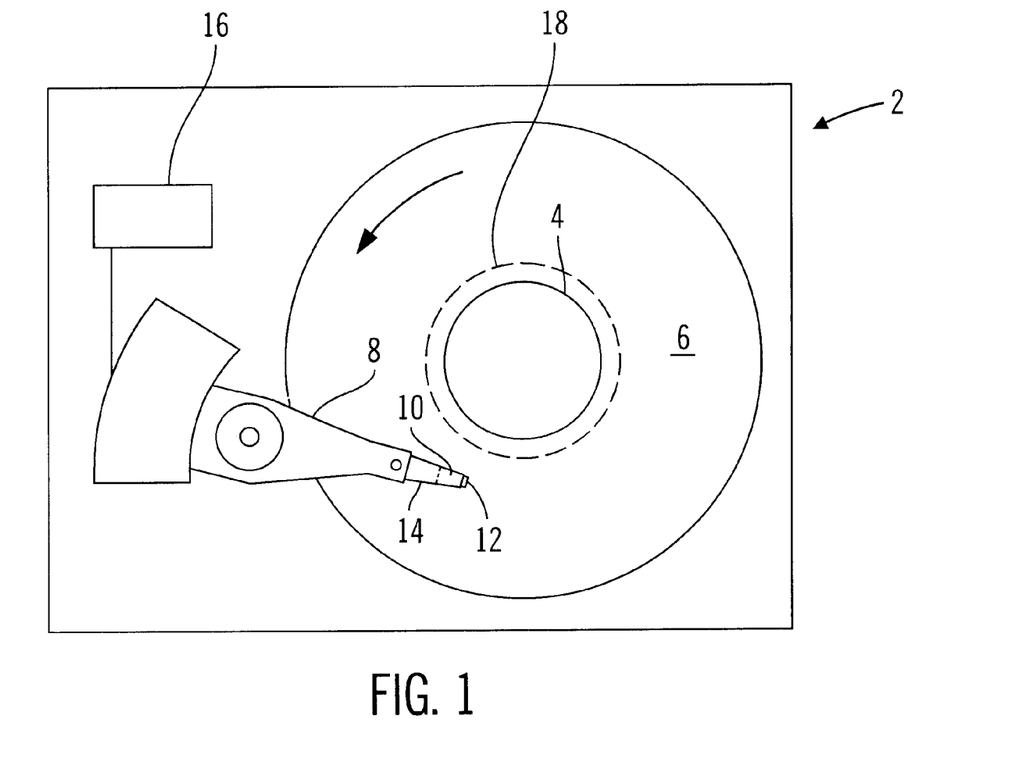
FIG. 1 is a schematic planar view of a magnetic disk drive.
Figure 2:
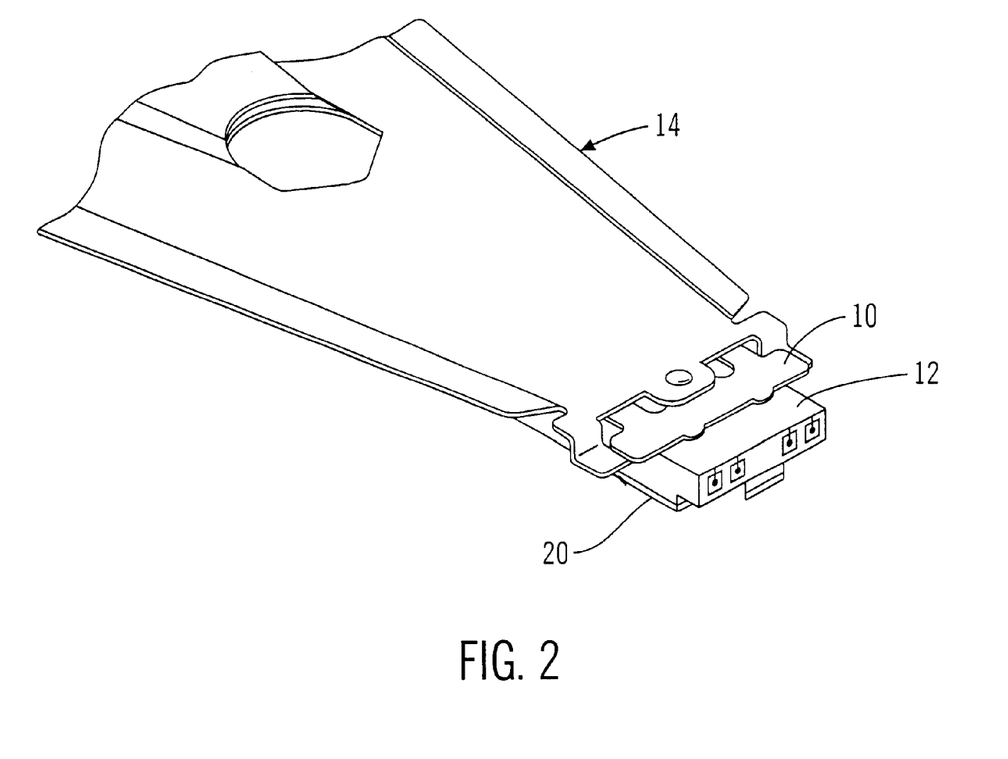
FIG. 2 is an isometric illustration of a suspension system for supporting the slider.

Referring now to the drawings, a magnetic disk drive and like parts are illustrated in FIGS. 1–2. The magnetic disk drive 2 includes a spindle 4, which supports and rotates a magnetic disk 6. A motor 18 which is controlled by a controller 16 rotates the spindle 4. A magnetic read/write head (not shown) is mounted on the slider 12, which in turn is supported by a head gimbal assembly 10. The slider 12 is covered with an overcoat layer 20, to prevent wear and corrosion. The overcoat layer 20 is formed, as will be demonstrated later, by depositing and etching of various materials in accordance with the present invention. The head gimbal assembly 10 is mounted to a suspension 14 and actuator arm 8. The suspension 14 and actuator arm 8 position the slider 12 in a transducing relationship with the surface of the magnetic disk 6. When the motor 18 rotates the magnetic disk 6, the slider 12 is supported on a thin cushion of air bearing between the magnetic disk 6 and an ABS. The disk drive may have a plurality of disks 6, each operable with a suspension 14 and head gimbal assembly 10.

General description of a magnetic disk drive and magnetic head assembly, which may use a magnetic head slider with improved ABS made in accordance with this invention, can be found in U.S. Pat. No. 5,943,187. The U.S. Pat. No. 5,943,187 is hereby incorporated by reference.

Figure 7:
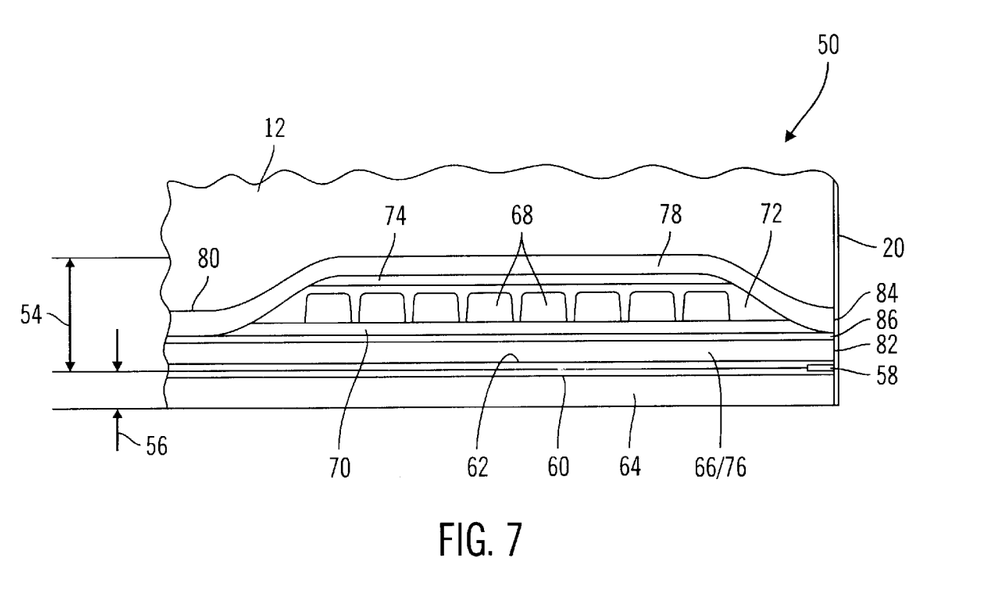
FIG. 7 is a cross-sectional elevation view of a merged magnetoresistive head.

FIG. 7 is a side cross-sectional elevation view of a merged magnetoresistive (MR) head 50, which has a write head portion 54 and a read head portion 56. The read head portion includes an MR sensor 58 is sandwiched between first and second gap layers 60 and 62 that are in turn sandwiched between first and second shield layers 64 and 66. In response to external magnetic fields, the resistance of the MR sensor 58 changes. A sense current conducted through the sensor causes these resistance changes to be manifested as potential changes that are processed by a processing circuitry (e.g., embodied in the controller 16).

The write head portion 54 of the head includes a coil layer 68 sandwiched between first and second insulation layers 70 and 72. A third insulation layer 74 may be employed for planarizing the head to eliminate ripples in the second insulation layer caused by the coil layer 68. The first, second and third insulation layers are referred to in the art as an "insulation stack." The coil layer 68, and the first, second and third insulation layers 70, 72 and 74 are sandwiched between first and second pole piece layers 76 and 78. The first and second pole piece layers 76 and 78 are magnetically coupled at a back gap 80 and have first and second pole tips 82 and 84, which are separated by a nonmagnetic magnetic gap layer 86 at the ABS.

Figure 8:
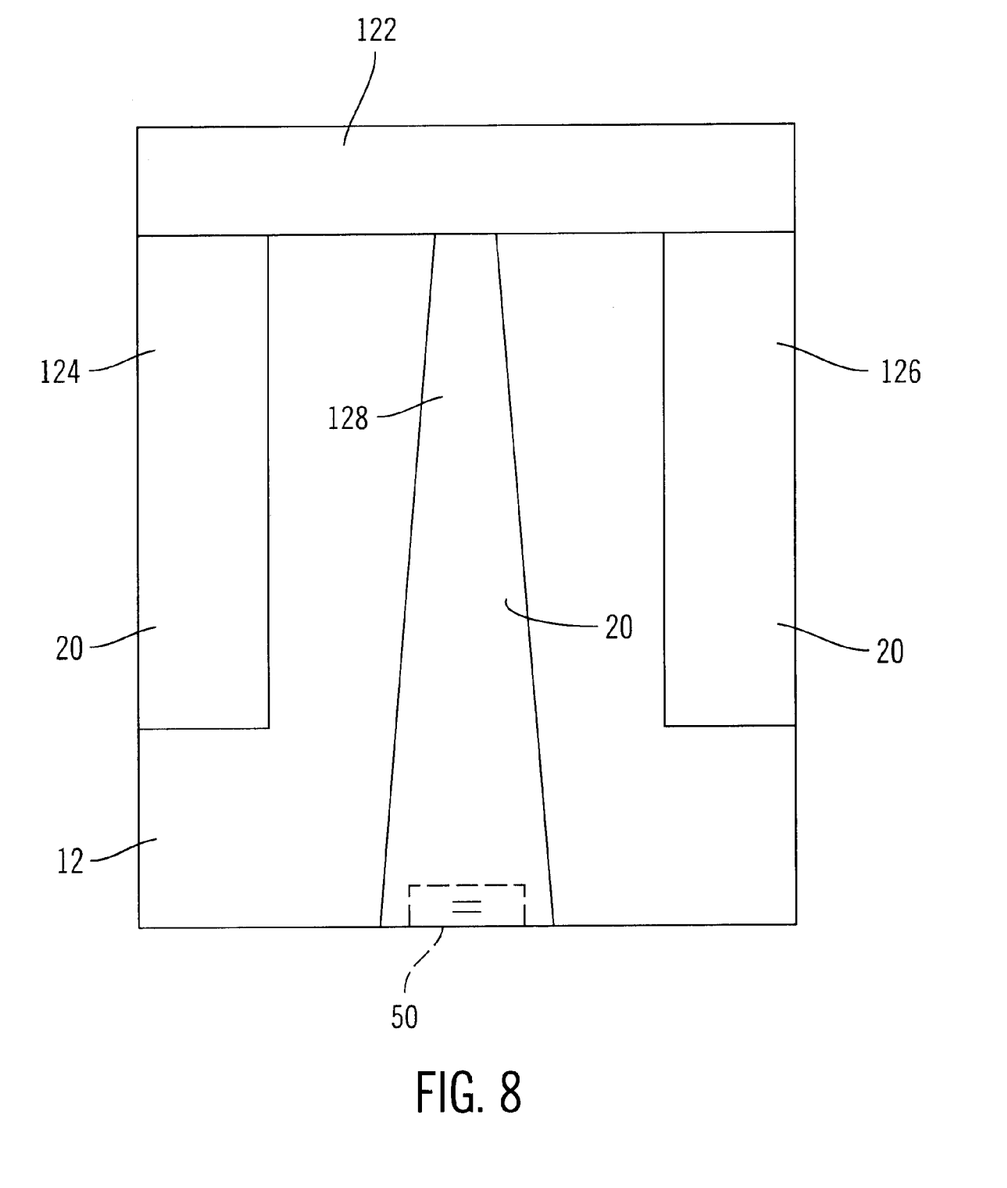
FIG. 8 is a view of an ABS surface of the slider.

An overcoat layer 20 is required to prevent wear and corrosion of the sensitive elements 84, 86, 82 and 58. As shown in FIG. 8, the slider 12 has a taper 122 at a leading edge, side rails 124 and 126 and a center rail 128, the center rail 128 extending to a trailing edge of the slider for supporting the magnetic head 50. In the manufacture of the slider, the rails 124, 126 and 128 and the ABS of the magnetic head 50 are lapped by a grinding process, which leaves minute scratches thereon, the scratches appearing as trenches when viewed with an atomic force microscope (AFM). Further, as the slider 12 is formed by laminating various dissimilar materials. Experiments have shown that areas where the dissimilar materials interface are subject to more severe corrosion, even after a protective DLC film has been deposited on the slider.

FIGS. 3–6 illustrate one method of the present invention, for preparing the ABS of a slider and the sensitive element by grading the surface topography for improved step-coverage coverage of a DLC film.

Figure 3:
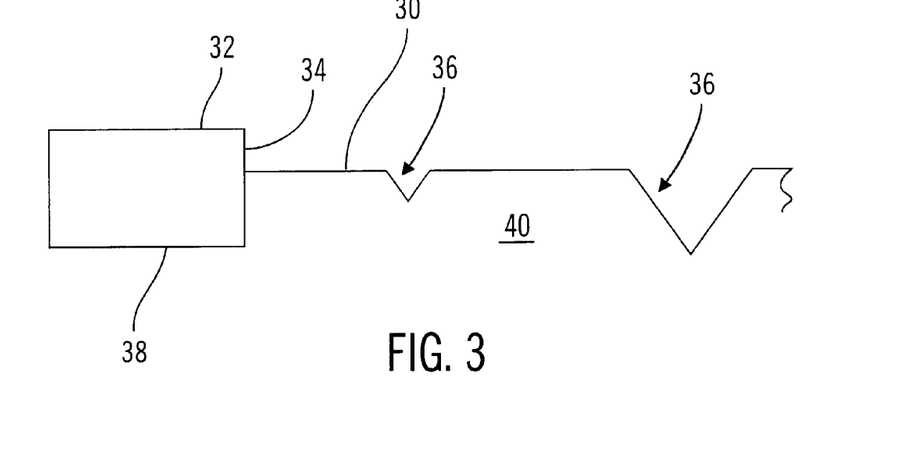
FIG. 3 is a schematic illustration of an ABS surface region of a magnetic device.

FIG. 3 is a section view of a portion of the ABS of a slider after the slider has been lapped and/or polished. FIG. 3 demonstrates an exaggerated surface topography, which contains both areas where dissimilar materials interface as well as areas with scratches or irregularities on the surface caused during the fabrication of the slider.

By way of examples, FIG. 3 demonstrates the interface of two different materials. As shown in FIG. 3, portion 38 is made of $Al_2O_3$, which is laminated to a portion 40 made of NiFe. It can be appreciated that portions 38 and 40 can be made of other materials, which are laminated to form the slider 50. As shown in FIG. 3, the ABS has an exaggerated profile comprising of a top horizontal surface 32, lower horizontal surface 30, vertical step 34, and scratches 36 for explanatory purposes.

Figure 4:
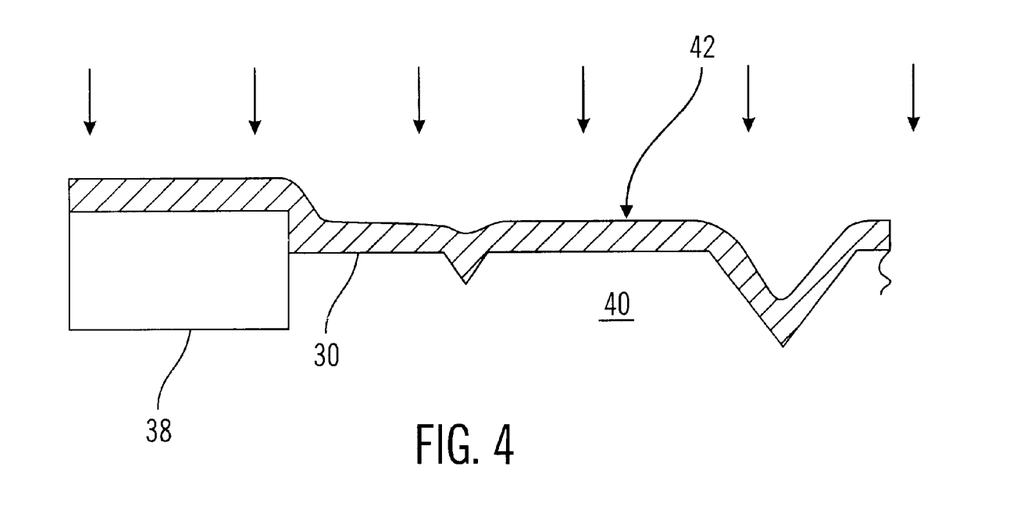
FIG. 4 is a schematic illustration of the present method with thin film deposition on the ABS surface region.

FIG. 4 illustrates the first step in the method of the present invention involving the deposition of a filler overcoat 42 on the exposed slider surface. The filler overcoat 42 functions as a filler as well as an adhesion layer filling scratches 36 and surface steps 34 that may exist. Larger scratches 36 may be covered to an extent depending on the thickness of the filler 42. The thickness of filler overcoat 42 chosen depends largely on the anticipated height of the surface steps 34 and scratches 36 and is typically within a thickness range of 50–100 Angstroms. The filler overcoat 42 is typically thicker than the intended DLC layer that will be subsequently deposited. The materials used for the filler overcoat 42 are preferably insulating, nonmagnetic, and exhibits high adhesion strength to the underlying surface. Some examples of materials for the overcoat filler 42 include, but are not limited to, Silicon (Si), $Al_2O_3$, $SiO_2$ and SiNx.

Figure 5:
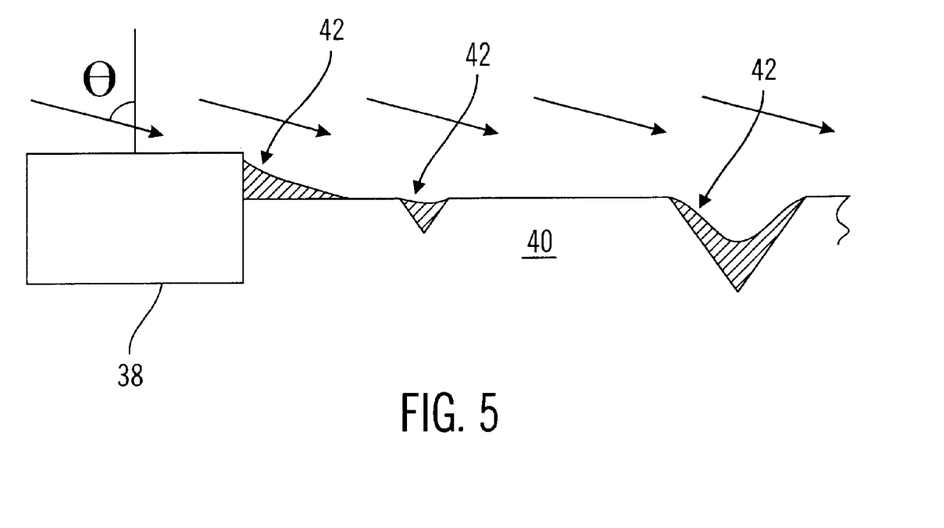
FIG. 5 is a schematic illustration of the present method showing the ABS surface after being sputter etched at a glancing angle.

After the deposition of the filler overcoat 42, as shown in FIG. 4, portions of the filler overcoat 42 are removed by etching at a glancing angle as depicted by the arrows in FIG. 5. While etching the substrate, the substrate can be rotated to reduce grading asymmetry. Etching can be performed by using any one of the conventional ion sputtering methods. The purpose of the glancing angle sputtering is to preferentially remove portions of the filler overcoat film 42 unshadowed by the surface topography. The glancing angle etching allows faster removal of filler overcoat 42 on the top horizontal surface 32 and lower horizontal surface 30 than those areas shaded, for example, at step 34 and within the scratches 36. Some of the filler material removed may be redistributed on the sidewall of the larger scratches depending on the operating condition. The glancing angle (measured from the normal to the horizontal surfaces), $\theta$, is typically between 60 to 85 degrees. The angles can be chosen and controlled so that previously pronounced surface irregularities can be significantly reduced. After the glancing angle etch, it is anticipated that the overall topography of the slider ABS will have improved smoothness, compared to the original surface topography, as demonstrated in FIG. 3. For ease of reference, the graded surface is referred to as Surface-Topographically-Graded (STG) surface.

Figure 6:
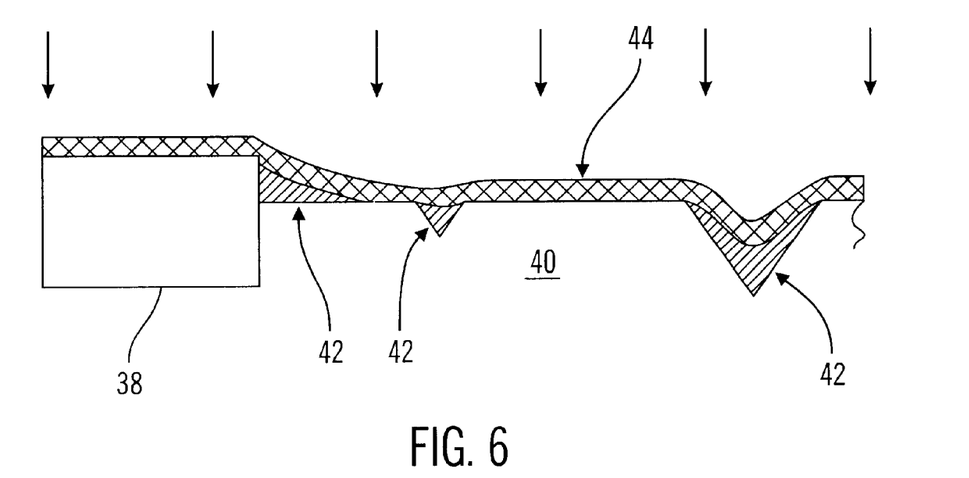
FIG. 6 is a schematic illustration of the present method after the deposition of the DLC film.

FIG. 6 illustrates the final step in the process, in which a final protective overcoat 44 is deposited onto the STG surface. The deposition can be performed by conventional methods such as, sputter deposition, ion beam deposition, etc. The deposition angle may be any taught by prior art. One of the typical materials used for such final protective overcoat is Diamond-Like-Carbon (DLC).

The following are some illustrative examples and variations for the procedures generally described above.

EXAMPLE NO. 1

Silicon (Si) Filler Film (a) First, deposit 50–100 Å of Si on the ungraded surface;
(b) Then, apply in-situ glancing angle sputter to etch away the silicon that is unshadowed by the glancing angle etch to create the STG surface;
(c) Finally, deposit thin adhesion layer of Si (5–10 Å) followed by a layer of DLC of desired thickness (e.g. 30 Å–50 Å) onto the STG surface.

EXAMPLE NO. 2

$SiO_2$ Filler Film (a) First, deposit 50–100 Å of Si on the ungraded surface;
(b) Then, expose the silicon to an oxygen environment (either ambient or plasma) for oxidation of silicon to form $SiO_2$;
(c) Apply glancing angle sputter etching to the $SiO_2$ layer to create the STG surface;
(d) Finally, deposit a layer of Si/DLC of desired thickness onto the STG surface as in (C) of Example 1.

EXAMPLE NO. 3

$SiO_2$ Filler Film

Same steps as Example No. 2, except that steps (b) and (c) in Example No. 2 are reversed. It is anticipated that the oxidation of the silicon after the glancing angle etch may expand the deposited filler to provide smoother edges.

EXAMPLE NO. 4

$Al_2O_3$ Filler Film

Same steps as Example No. 1, except that in this case, silicon is replaced with Aluminum Oxide.

It should be understood that the present invention could be employed for providing a graded surface on articles other than a slider and sensitive element of a magnetic head (e.g., a magnetic disk). In particular, it is useful for any article having scratches covered with a coating that can be sputter etched.

While the present invention has been described with respect to the preferred embodiments in accordance therewith, it will be apparent to those in the skilled art that various modifications and improvements may be made without departing from the scope and spirit of the invention. The present invention is applicable for grading other types of surfaces to improve step coverage of an overcoat, for use in other devices. Other etching techniques such as ion milling may be used instead of sputter etching. Accordingly, the disclosed invention is to be considered merely as illustrative and limited in scope only as specified in the appended claims.

What is claimed is:

1. A method of grading an unfinished air bearing surface of a slider for a magnetic disk drive having surface irregularities including recessed portions in the unfinished air bearing surface, comprising the steps of:
    depositing a layer of filler material on the unfinished air bearing surface, covering the surface irregularities; and
    etching the layer of filler material by directing particles at an oblique incident angle at the layer of filler material such that all of the filler material is removed except at the recessed portions.

2. The method as in claim 1, wherein the etching step comprises sputter etching.

3. The method as in claim 1, wherein the etching step comprises ion milling.

4. The method as in claim 1, wherein the oblique incident angle is less than 85 degrees with respect to a normal to the unfinished air bearing surface.

5. The method as in claim 4, wherein the oblique incident angle is more than 60 degrees from the normal to the unfinished air bearing surface.

6. The method as in claim 1, further comprising the step of depositing a protective overcoat over the unfinished air bearing surface including the etched filler material.

7. The method as in claim 1, wherein the filler material comprises one of Silicon, $Al_2O_3$, $SiO_2$ and Nitride of Silicon.

8. The method as in claim 6, wherein the protective overcoat comprises a diamond-like-carbon material.

9. A method of finishing an air bearing surface on a slider for a magnetic disk drive, comprising the steps of:
    forming a base surface of the slider, said surface having surface irregularities comprising recessed portions in the surface;

depositing a layer of filler material on the base surface, covering the surface irregularities; and etching the layer of filler material by directing particles at an oblique incident angle at the layer of filler material such that all of the filler material is removed except at the recessed portions.

10. The method as in claim 9, further comprising the step of depositing a protective overcoat covering the base surface including the filler material to form the air bearing surface of the slider.

11. A method of grading a surface having surface irregularities including recessed portions in the surface, comprising the steps of:

depositing a layer of filler material on the surface, covering the surface irregularities;

etching the layer of filler material by directing particles at an oblique incident angle at the layer of filler material such that all of the filler material is removed except at the recessed portions; and depositing a diamond-like-carbon material protective overcoat over the surface including the etched filler material.

12. The method as in claim 11, wherein the etching step comprises sputter etching.

13. The method as in claim 11, wherein the etching step comprises ion milling.

14. The method as in claim 11, wherein the oblique incident angle is less than 85 degrees with respect to a normal to the surface.

15. The method as in claim 14, wherein the oblique incident angle is more than 60 degrees from the normal to the surface.

* * * * *